(12) United States Patent
Ostroff

(10) Patent No.: US 7,623,920 B2
(45) Date of Patent: Nov. 24, 2009

(54) LOW POWER A/D CONVERTER

(75) Inventor: Alan H. Ostroff, San Clemente, CA (US)

(73) Assignee: Cameron Health, Inc., San Clemente, CA (US)

(*) Notice: Subject to any disclaimer, the term of this patent is extended or adjusted under 35 U.S.C. 154(b) by 512 days.

(21) Appl. No.: 11/170,839

(22) Filed: Jun. 30, 2005

(65) Prior Publication Data

US 2005/0240113 A1 Oct. 27, 2005

Related U.S. Application Data

(63) Continuation of application No. 10/011,948, filed on Nov. 5, 2001, now Pat. No. 6,927,721.

(51) Int. Cl.
*A61N 1/375* (2006.01)

(52) U.S. Cl. ............... 607/28; 607/27; 607/37

(58) Field of Classification Search .......... None
See application file for complete search history.

(56) References Cited

U.S. PATENT DOCUMENTS

| | | | |
|---|---|---|---|
| 3,653,387 A | 4/1972 | Ceier |
| 3,710,374 A | 1/1973 | Kelly |
| 3,737,897 A | 6/1973 | Cuthbert et al. |
| 3,827,046 A | 7/1974 | Watson |
| 3,911,925 A | 10/1975 | Tillery, Jr. |
| 4,030,509 A | 6/1977 | Heilman et al. |
| 4,157,720 A | 6/1979 | Greatbatch |
| 4,164,946 A | 8/1979 | Langer |
| 4,184,493 A | 1/1980 | Langer et al. |
| 4,191,942 A | 3/1980 | Long |
| 4,210,149 A | 7/1980 | Heilman et al. |
| RE30,387 E | 8/1980 | Denniston, III et al. |
| 4,223,678 A | 9/1980 | Langer et al. |
| 4,248,237 A | 2/1981 | Kenny |
| 4,254,775 A | 3/1981 | Langer |

(Continued)

FOREIGN PATENT DOCUMENTS

DE 298 01 807 U1 7/1998

(Continued)

OTHER PUBLICATIONS

Bardy, Gust H. et al., "Multicenter Experience with a Pectoral Unipolar Implantable Cardioverter-Defibrillator," *JACC*, Aug. 1996, vol. 28, No. 2, pp. 400-410.

(Continued)

*Primary Examiner*—Carl H. Layno
*Assistant Examiner*—Jon-Eric C. Morales
(74) *Attorney, Agent, or Firm*—Pramudji Wendt & Tran, LLP; Ari Pramudji; Mark Schroeder

(57) ABSTRACT

A comparator is arranged to compare a series of analog voltage signal samples on a first capacitor with a voltage on a second capacitor which is linearly increased or decreased to equal the sample value. The comparator's single output freezes the count of the counter at counts which are proportional to the voltage of the respective samples. In this manner, analog to digital conversion can be accomplished using a single line between the analog and digital sides of a circuit, thereby reducing parasitic capacitance.

13 Claims, 3 Drawing Sheets

U.S. PATENT DOCUMENTS

| | | | |
|---|---|---|---|
| 4,291,707 A | 9/1981 | Heilman et al. | |
| 4,300,567 A | 11/1981 | Kolenik et al. | |
| 4,314,095 A | 2/1982 | Moore et al. | |
| 4,375,817 A | 3/1983 | Engle et al. | |
| 4,402,322 A | 9/1983 | Duggan | |
| 4,407,288 A | 10/1983 | Langer et al. | |
| 4,424,818 A | 1/1984 | Doring et al. | |
| 4,450,527 A | 5/1984 | Sramek | |
| 4,548,209 A | 10/1985 | Wielders et al. | |
| 4,567,900 A | 2/1986 | Moore | |
| 4,595,009 A | 6/1986 | Leinders | |
| 4,602,637 A | 7/1986 | Elmqvist et al. | |
| 4,603,705 A | 8/1986 | Speicher et al. | |
| 4,693,253 A | 9/1987 | Adams | |
| 4,727,877 A | 3/1988 | Kallok | |
| 4,750,494 A | 6/1988 | King | |
| 4,765,341 A | 8/1988 | Mower et al. | |
| 4,768,512 A | 9/1988 | Imran | |
| 4,800,883 A | 1/1989 | Winstrom | |
| 4,830,005 A | 5/1989 | Woskow | |
| 4,901,079 A | 2/1990 | Nagashima et al. | |
| 4,944,300 A | 7/1990 | Saksena | |
| 5,044,374 A | 9/1991 | Lindemans et al. | |
| 5,105,810 A | 4/1992 | Collins et al. | |
| 5,105,826 A | 4/1992 | Smits et al. | |
| 5,109,842 A | 5/1992 | Adinolfi | |
| 5,129,392 A | 7/1992 | Bardy et al. | |
| 5,133,353 A | 7/1992 | Hauser | |
| 5,144,946 A | 9/1992 | Weinberg et al. | |
| 5,184,616 A | 2/1993 | Weiss | |
| 5,191,901 A | 3/1993 | Dahl et al. | |
| 5,203,348 A | 4/1993 | Dahl et al. | |
| 5,215,081 A | 6/1993 | Ostroff | |
| 5,230,337 A | 7/1993 | Dahl et al. | |
| 5,255,692 A | 10/1993 | Neubauer et al. | |
| 5,261,400 A | 11/1993 | Bardy | |
| 5,300,106 A | 4/1994 | Dahl et al. | |
| 5,313,953 A | 5/1994 | Yomtov et al. | |
| 5,331,966 A | 7/1994 | Bennett et al. | |
| 5,342,407 A | 8/1994 | Dahl et al. | |
| 5,366,496 A | 11/1994 | Dahl et al. | |
| 5,376,103 A | 12/1994 | Anderson et al. | |
| 5,376,104 A | 12/1994 | Sakai et al. | |
| 5,385,574 A | 1/1995 | Hauser et al. | |
| 5,391,200 A | 2/1995 | KenKnight et al. | |
| 5,405,363 A | 4/1995 | Kroll et al. | |
| 5,411,539 A | 5/1995 | Neisz | |
| 5,411,547 A | 5/1995 | Causey, III | |
| 5,413,591 A | 5/1995 | Knoll | |
| 5,423,326 A | 6/1995 | Wang et al. | |
| 5,431,692 A * | 7/1995 | Hansen et al. | 607/28 |
| 5,439,485 A | 8/1995 | Mar et al. | |
| 5,447,521 A | 9/1995 | Anderson et al. | |
| 5,476,503 A | 12/1995 | Yang | |
| 5,507,781 A | 4/1996 | Kroll et al. | |
| 5,509,923 A | 4/1996 | Middleman et al. | |
| 5,509,928 A | 4/1996 | Acken | |
| 5,531,765 A | 7/1996 | Pless | |
| 5,531,766 A | 7/1996 | Kroll et al. | |
| 5,534,019 A | 7/1996 | Paspa | |
| 5,534,022 A | 7/1996 | Hoffmann et al. | |
| 5,573,003 A * | 11/1996 | Mann et al. | 600/508 |
| 5,597,956 A | 1/1997 | Ito et al. | |
| 5,601,607 A | 2/1997 | Adams | |
| 5,603,732 A | 2/1997 | Dahl et al. | |
| 5,606,320 A * | 2/1997 | Kleks | 341/161 |
| 5,607,455 A | 3/1997 | Armstrong | |
| 5,618,287 A | 4/1997 | Fogarty et al. | |
| 5,620,477 A | 4/1997 | Pless et al. | |
| 5,643,328 A | 7/1997 | Cooke et al. | |
| 5,645,586 A | 7/1997 | Meltzer | |
| 5,658,317 A | 8/1997 | Haefner et al. | |
| 5,658,319 A | 8/1997 | Kroll | |
| 5,658,321 A | 8/1997 | Fayram et al. | |
| 5,674,260 A | 10/1997 | Weinberg | |
| 5,690,648 A | 11/1997 | Fogarty et al. | |
| 5,690,683 A | 11/1997 | Haefner et al. | |
| 5,697,953 A | 12/1997 | Kroll et al. | |
| 5,713,926 A | 2/1998 | Hauser et al. | |
| 5,718,242 A | 2/1998 | McClure et al. | |
| 5,766,226 A | 6/1998 | Pedersen | |
| 5,776,169 A | 7/1998 | Schroeppel | |
| 5,814,090 A | 9/1998 | Latterell et al. | |
| 5,827,326 A | 10/1998 | Kroll et al. | |
| 5,836,976 A | 11/1998 | Min et al. | |
| 5,843,132 A | 12/1998 | Ilvento | |
| 5,895,414 A | 4/1999 | Sanchez-Zambrano | |
| 5,904,705 A | 5/1999 | Kroll et al. | |
| 5,919,211 A | 7/1999 | Adams | |
| 5,919,222 A | 7/1999 | Hjelle et al. | |
| 5,925,069 A | 7/1999 | Graves et al. | |
| 5,935,154 A | 8/1999 | Westlund | |
| 5,941,904 A | 8/1999 | Johnston et al. | |
| 5,957,956 A | 9/1999 | Kroll et al. | |
| 6,014,586 A | 1/2000 | Weinberg et al. | |
| 6,026,325 A | 2/2000 | Weinberg et al. | |
| 6,058,328 A | 5/2000 | Levine et al. | |
| 6,093,173 A | 7/2000 | Balceta et al. | |
| 6,095,987 A | 8/2000 | Shmulewitz et al. | |
| 6,096,063 A | 8/2000 | Lopin et al. | |
| H1905 H | 10/2000 | Hill | |
| 6,128,531 A | 10/2000 | Campbell-Smith | |
| 6,144,866 A | 11/2000 | Miesel et al. | |
| 6,144,879 A | 11/2000 | Gray | |
| 6,148,230 A | 11/2000 | KenKnight | |
| 6,169,921 B1 | 1/2001 | KenKnight et al. | |
| 6,185,450 B1 | 2/2001 | Seguine et al. | |
| 6,208,895 B1 | 3/2001 | Sullivan et al. | |
| 6,241,751 B1 | 6/2001 | Morgan et al. | |
| 6,266,567 B1 | 7/2001 | Ishikawa et al. | |
| 6,278,894 B1 | 8/2001 | Salo et al. | |
| 6,280,462 B1 | 8/2001 | Hauser et al. | |
| 6,334,071 B1 | 12/2001 | Lu | |
| 6,345,198 B1 | 2/2002 | Mouchawar et al. | |
| 6,411,844 B1 | 6/2002 | Kroll et al. | |
| 6,647,292 B1 | 11/2003 | Bardy et al. | |
| 6,721,597 B1 | 4/2004 | Bardy et al. | |
| 6,754,528 B2 | 6/2004 | Bardy et al. | |
| 6,778,860 B2 | 8/2004 | Ostroff et al. | |
| 6,788,974 B2 | 9/2004 | Bardy et al. | |
| 6,834,204 B2 | 12/2004 | Ostroff et al. | |
| 6,856,835 B2 | 2/2005 | Bardy et al. | |
| 6,865,417 B2 | 3/2005 | Rissmann et al. | |
| 6,866,044 B2 | 3/2005 | Bardy et al. | |
| 2001/0027330 A1 | 10/2001 | Sullivan et al. | |
| 2003/0179123 A1 | 9/2003 | DeVilbiss | |

FOREIGN PATENT DOCUMENTS

| | | |
|---|---|---|
| EP | 0 095 727 A1 | 12/1983 |
| EP | 0 316 616 A2 | 5/1989 |
| EP | 0 316 816 A3 | 5/1989 |
| EP | 0 347 353 A1 | 12/1989 |
| EP | 0 517 494 A1 | 12/1992 |
| EP | 0 518 599 A2 | 12/1992 |
| EP | 0 518 599 B1 | 12/1992 |
| EP | 1 517 494 B1 | 12/1992 |
| EP | 0 536 873 B1 | 4/1993 |
| EP | 0 586 858 B1 | 3/1994 |
| EP | 0 627 237 A1 | 12/1994 |
| EP | 0 641 573 A2 | 3/1995 |
| EP | 0 641 573 A3 | 3/1995 |
| EP | 0 677 301 A1 | 10/1995 |
| EP | 0 917 887 A1 | 5/1999 |

| | | | |
|---|---|---|---|
| EP | 0 923 130 A1 | 6/1999 |
| EP | 1 000 634 A1 | 5/2000 |
| WO | WO 93/19809 A1 | 10/1993 |
| WO | WO 97/29802 A2 | 8/1997 |
| WO | WO 98/25349 A1 | 6/1998 |
| WO | WO 99/03534 A1 | 1/1999 |
| WO | WO 99/37362 A1 | 7/1999 |
| WO | WO 99/53991 A1 | 10/1999 |
| WO | WO 00/41766 A1 | 7/2000 |
| WO | WO 00/50120 A1 | 8/2000 |
| WO | WO 01/43649 A1 | 6/2001 |
| WO | WO 01/56166 A2 | 8/2001 |
| WO | WO 02/22208 A2 | 3/2002 |
| WO | WO 02/22208 A3 | 3/2002 |
| WO | WO 02/24275 A2 | 3/2002 |
| WO | WO 02/24275 A3 | 3/2002 |
| WO | WO 02-068046 A1 | 9/2002 |
| WO | WO 03/018121 A2 | 3/2003 |

OTHER PUBLICATIONS

Friedman, Richard A. et al., "Implantable Defibrillators In Children: From Whence to Shock," *Journal of Cardiovascular Electrophysiology*, vol. 12, No. 3, Mar. 2001, pp. 361-362.

Gradaus, Rainer et al., "Nonthoracotomy Implantable Cardioverter Defibrillator Placement in Children: Use of Subcutaneous Array Leads to Abdominally Placed Implantable Cardioverter Defibrillators in Children," *Journal of Cardiovascular Electrophysiology*, vol. 12, No. 3, Mar. 2001, pp. 356-360.

Higgins, Steven L. et al., "The First Year Experience with the Dual Chamber ICD," *PACE*, Jan. 2000, vol. 23, pp. 18-25.

Mirowski, M. et al., "Automatic Detection and Defibrillation of Lethal Arrhythmias-A New Concept," *JAMA*, vol. 213, No. 4, Jul. 27, 1970, pp. 615-616.

Olson, Walter H. et al., "Onset and Stability for Ventricular Tachyarrhythmia Detection in an Implantable Pacer-Cardioverter-Defibrillator," *IEEE*, (1987) pp. 167-170.

Schuder, John C., "Completely Implanted Defibrillator," *JAMA*, vol. 214, No. 6, Nov. 9, 1970. p. 1123 (single sheet).

Schuder, John C. et al., "Experimental Ventricular Defibrillation with an Automatic and Completely Implanted System," *Trans. Amer. Soc. Artif. Int. Organs*, vol. XVI (1970) pp. 207-212.

Schuder, John C., "The Role of an Engineering Oriented Medical Research Group in Developing Improved Methods and Devices for Achieving Ventricular Defibrillation: The University of Missouri Experience," *PACE*, vol. 16, Jan. 1993, pp. 95-124.

Schuder, John C. et al., "Standby Implanted Defibrillators," *Arch Intern. Med*, vol. 127, Feb. 1971, p. 317 (single sheet).

Schuder, John C. et al., "Transthoracic Ventricular Defibrillation in the Dog with Truncated and Untruncated Exponential Stimuli," *IEEE Transactions on Bio-Medical Engineering*, vol. BME-18, No. 6, Nov. 1971, pp. 410-415.

Schwacke, H. et al., "Komplikationen mit Sonden bei 340 Patienten mit einem Implantierbaren kardioverter/Defibrillator," *Z Kardiol* (1999) vol. 88, No. 8, pp. 559-565.

Tietze U. et al., "Halbleiter-Schaltungstechnik," © Springer-Verlag (Berlin, Germany), (1991), pp. 784-786.

Valenzuela, Terrence D. et al., "Outcomes of Rapid Defibrillation by Security Officers After Cardiac Arrest in Casinos," *The New England Journal of Medicine*, Oct. 26, 2000, vol. 343, No. 17, pp. 1206-1209.

Walters, R.A. et al., "Analog to Digital Conversion Techniques in Implantable Devices," *Annual International Conference of the IEEE Engineering in Medicine and Biology Society*, vol. 13 No. 4 (1991) p. 1674-1676.

* cited by examiner

LOW POWER A/D CONVERTER

CROSS REFERENCE TO CO-PENDING AND RELATED APPLICATIONS

This application is a continuation of U.S. application Ser. No. 10/011,948, filed Nov. 5, 2001, now U.S. Pat. No. 6,927,721, and the entire disclosure of which is incorporated herein by reference.

The invention of the present application may find application in systems such as are disclosed in U.S. patent application Ser. No. 09/663,607, filed Sep. 18, 2000, now U.S. Pat. No. 6,721,597, and U.S. patent application Ser. No. 09/663,606, filed Sep. 18, 2000, now U.S. Pat. No. 6,647,292, the entire disclosures of which are incorporated herein by reference.

In addition, the foregoing applications are related to U.S. patent application Ser. No. 09/940,283, filed Aug. 27, 2001, now U.S. Pat. No. 7,065,407; U.S. patent application Ser. No. 09/940,371, filed Aug. 27, 2001, now U.S. Pat. No. 7,039,465; U.S. patent application Ser. No. 09/940,468, filed Aug. 27, 2001, abandoned; U.S. patent application Ser. No. 09/941,814, filed Aug. 27, 2001, abandoned; U.S. patent application Ser. No. 09/940,356, filed Aug. 27, 2001, abandoned; U.S. patent application Ser. No. 09/940,340, filed Aug. 27, 2001, now U.S. Pat. No. 6,937,907; U.S. patent application Ser. No. 09/940,287, filed Aug. 27, 2001, abandoned; U.S. patent application Ser. No. 09/940,377, filed Aug. 27, 2001, now U.S. Pat No. 6,866,044; U.S. patent application Ser. No. 09/940,599, filed Aug. 27, 2001, now U.S. Pat. No. 6,950,705; U.S. patent application Ser. No. 09/940,373, filed Aug. 27, 2001, now U.S. Pat. No. 6,788,974; U.S. patent application Ser. No. 09/940,273, filed Aug. 27, 2001, now U.S. Pat. No. 7,069,080; U.S. patent application Ser. No. 09/940,378, filed Aug. 27, 2001, now U.S. Pat. No. 7,146,212; and U.S. patent application Ser. No. 09/940,266, filed Aug. 27, 2001, now U.S. Pat. No. 6,856,835, the entire disclosures of which are all incorporated herein by reference.

FIELD OF THE INVENTION

The subject invention relates to electronic circuitry and more particularly to analog-to-digital conversion circuitry particularly applicable to subcutaneous implantable cardioverter defibrillators.

BACKGROUND OF THE INVENTION

Defibrillation/cardioversion is a technique employed to counter arrhythmic heart conditions including some tachycardias in the atria and/or ventricles. Typically, electrodes are employed to stimulate the heart with electrical impulses or shocks, of a magnitude substantially greater than pulses used in cardiac pacing.

Defibrillation/cardioversion systems include body implantable electrodes that are connected to a hermetically sealed container housing the electronics, battery supply and capacitors. The entire system is referred to as implantable cardioverter/defibrillators (ICDs). The electrodes used in ICDs can be in the form of patches applied directly to epicardial tissue, or, more commonly, are on the distal regions of small cylindrical insulated catheters that typically enter the subclavian venous system, pass through the superior vena cava and, into one or more endocardial areas of the heart. Such electrode systems are called intravascular or transvenous electrodes. U.S. Pat. Nos. 4,603,705, 4,693,253, 4,944,300, 5,105,810, the disclosures of which are all incorporated herein by reference, disclose intravascular or transvenous electrodes, employed either alone, in combination with other intravascular or transvenous electrodes, or in combination with an epicardial patch or subcutaneous electrodes. Compliant epicardial defibrillator electrodes are disclosed in U.S. Pat. Nos. 4,567,900 and 5,618,287, the disclosures of which are incorporated herein by reference. A sensing epicardial electrode configuration is disclosed in U.S. Pat No. 5,476,503, the disclosure of which is incorporated herein by reference.

In addition to epicardial and transvenous electrodes, subcutaneous electrode systems have also been developed. For example, U.S. Pat. Nos. 5,342,407 and 5,603,732, the disclosures of which are incorporated herein by reference, teach the use of a pulse monitor/generator surgically implanted into the abdomen and subcutaneous electrodes implanted in the thorax. This system is far more complicated to use than current ICD systems using transvenous lead systems together with an active can electrode and therefore it has no practical use. It has in fact never been used because of the surgical difficulty of applying such a device (3 incisions), the impractical abdominal location of the generator and the electrically poor sensing and defibrillation aspects of such a system.

Recent efforts to improve the efficiency of ICDs have led manufacturers to produce ICDs which are small enough to be implanted in the pectoral region. In addition, advances in circuit design have enabled the housing of the ICD to form a subcutaneous electrode. Some examples of ICDs in which the housing of the ICD serves as an optional additional electrode are described in U.S. Pat. Nos. 5,133,353; 5,261,400; 5,620,477; and 5,658,321, the disclosures of which are incorporated herein by reference.

ICDs are now an established therapy for the management of life threatening cardiac rhythm disorders, primarily ventricular fibrillation (V-Fib). ICDs are very effective at treating V-Fib, but are therapies that still require significant surgery.

As ICD therapy becomes more prophylactic in nature and used in progressively less ill individuals, especially children at risk of cardiac arrest, the requirement of ICD therapy to use intravenous catheters and transvenous leads is an impediment to very long term management as most individuals will begin to develop complications related to lead system malfunction sometime in the 5-10 year time frame, often earlier. In addition, chronic transvenous lead systems, their reimplantation and removals, can damage major cardiovascular venous systems and the tricuspid valve, as well as result in life threatening perforations of the great vessels and heart. Consequently, use of transvenous lead systems, despite their many advantages, are not without their chronic patient management limitations in those with life expectancies of >5 years. The problem of lead complications is even greater in children where body growth can substantially alter transvenous lead function and lead to additional cardiovascular problems and revisions. Moreover, transvenous ICD systems also increase cost and require specialized interventional rooms and equipment as well as special skill for insertion. These systems are typically implanted by cardiac electrophysiologists who have had a great deal of extra training.

In addition to the background related to ICD therapy, the present invention requires a brief understanding of a related therapy, the automatic external defibrillator (AED). AEDs employ the use of cutaneous patch electrodes, rather than implantable lead systems, to effect defibrillation under the direction of a bystander user who treats the patient suffering from V-Fib with a portable device containing the necessary electronics and power supply that allows defibrillation. AEDs can be nearly as effective as an ICD for defibrillation if applied to the victim of ventricular fibrillation promptly, i.e., within 2 to 3 minutes of the onset of the ventricular fibrillation.

AED therapy has great appeal as a tool for diminishing the risk of death in public venues such as in air flight. However, an AED must be used by another individual, not the person suffering from the potential fatal rhythm. It is more of a public health tool than a patient-specific tool like an ICD. Because >75% of cardiac arrests occur in the home, and over half occur in the bedroom, patients at risk of cardiac arrest are often alone or asleep and can not be helped in time with an AED. Moreover, its success depends to a reasonable degree on an acceptable level of skill and calm by the bystander user.

What is needed therefore, especially for children and for prophylactic long term use for those at risk of cardiac arrest, is a combination of the two forms of therapy which would provide prompt and near-certain defibrillation, like an ICD, but without the long-term adverse sequelae of a transvenous lead system while simultaneously using most of the simpler and lower cost technology of an AED. What is also needed is a cardioverter/defibrillator that is of simple design and can be comfortably implanted in a patient for many years.

One factor which has added complexity to ICD design is the necessity to digitize an analog electrocardiogram (ECG) signal. For example, it may be desired to sample an ECG signal at intervals of 2 milliseconds or 4 milliseconds, i.e. at either a 250 Hz. or 500 Hz. sampling frequency.

Typically, an analog to digital converter (A/D) circuit is employed in such applications. In some cases, the environment includes an analog chip optimized for analog functions and a digital chip optimized for digital functions. Data may be transferred from the analog chip to the digital chip via, for example, an 8 bit A/D converter employing various known A/D conversion techniques, for example, successive approximation techniques, resistive ladders, or slope converters. In such an application, there would typically be a bus having 8 parallel lines connecting, for example, a microprocessor to an A/D converter located on an analog chip. A read/write control signal is then used to bring all 8 bits over a digital bus to the microprocessor.

One problem with this approach is that each of the bus lines has a parasitic capacitance associated with it. With respect to an eight bit bus, from 1 to all 8 of the parallel bus lines may toggle up or down on each cycle. Every time a line toggles it is necessary to charge up and discharge the parasitic capacitance associated with that line. The power lost due to this parasitic capacitance may be represented by the expression:

$$\left[\frac{n}{2}+1\right] \cdot Cp \cdot f \cdot V^2 \quad (1)$$

where "n" is the number of lines toggled, Cp is the value of the parasitic capacitance, f is the frequency, V is the voltage and "1" represents the parasitic capacitance associated with a read/write line, e.g., from a microprocessor. Equation (1) further employs the expression N over 2 because, on average, only half the bus signals will change state. If one increases the number of bits of the conversion to increase resolution, additional power will be lost. In some cases, the power loss can be worse because, if 10 bits are transferred to an 8 bit microprocessor, two transfers would be required and possibly another read/write signal line.

SUMMARY OF THE INVENTION

According to the invention, the value of an analog voltage sample derived on an analog side of an interface is used to control a count developed on a digital side of the interface. In this manner, a single control line crossing the analog/digital interface is used to develop a count corresponding to the value of the analog sample. In this manner, only a single signal line is subject to parasitic capacitance, as opposed to, for example, 8 or more parallel bus lines.

BRIEF DESCRIPTION OF THE DRAWINGS

For a better understanding of the invention, reference is now made to the drawings where like numerals represent similar objects throughout the figures and wherein.

DETAILED DESCRIPTION OF ILLUSTRATIVE EMBODIMENTS

Figure 1:
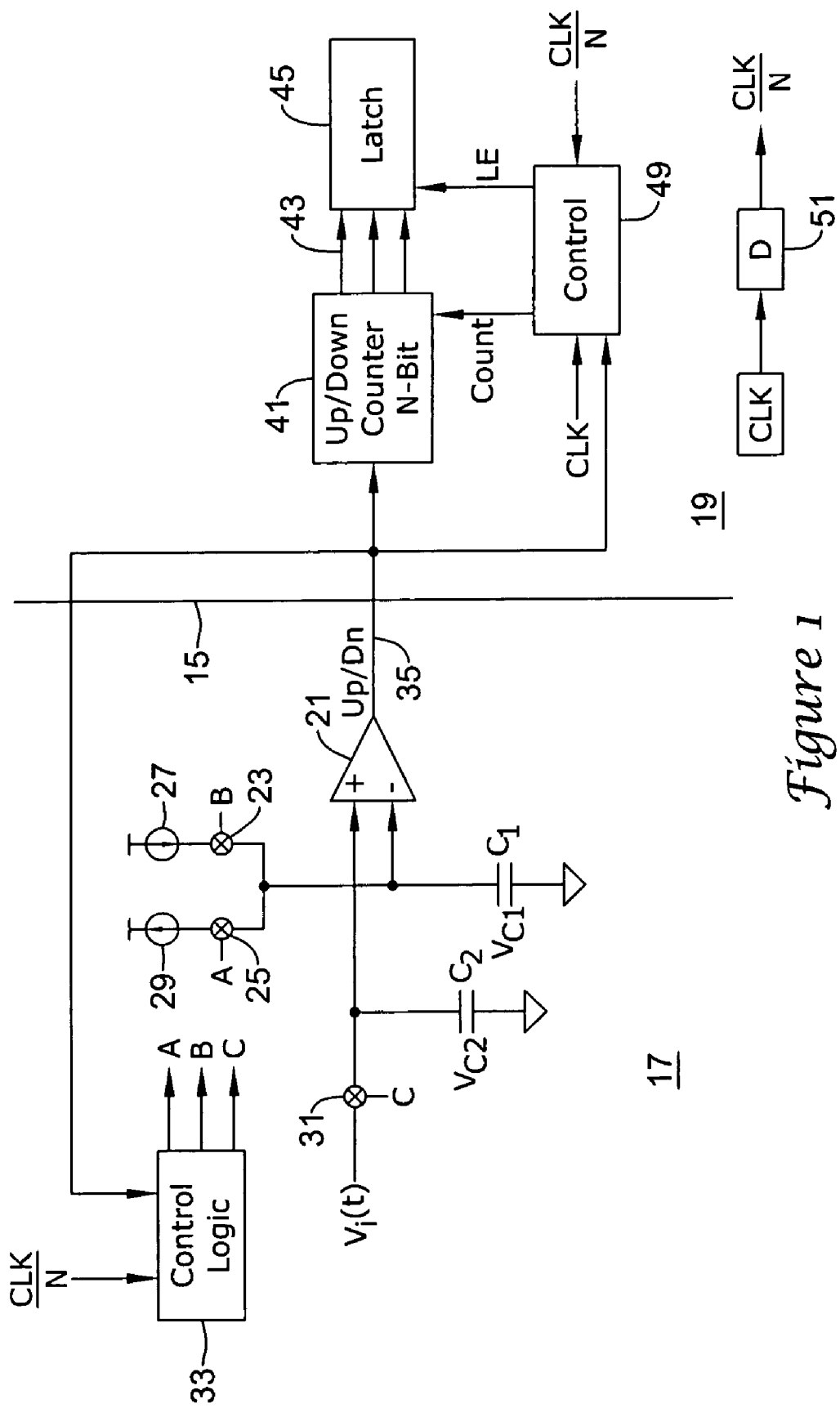
FIG. 1 is an electrical circuit diagram of an illustrative embodiment of the invention.

An illustrative embodiment is shown in FIG. 1, wherein the circuit is schematically divided by a line 15 into an analog side 17 and a digital side 19. The analog side 17 of the circuit includes a comparator 21 having an inverting input connected to a first terminal of a first capacitor $C_1$ and a non-inverting input connected to the first terminal of a second capacitor $C_2$. The second terminals of the respective capacitors $C_1$, $C_2$ are grounded.

The first terminal of the first capacitor $C_1$ is arranged to be connected via operation of respective switches 23, 25 to either a first charging current source 27 or a second discharging current source 29. The switches 23, 25 are controlled by respective control signals B, A.

The second capacitor $C_2$ is arranged to capture a sample of an analog input voltage Vi (t) which is to be converted to a digital value by the circuit. The sample is provided by momentarily closing a switch 31 in response to application of a third control signal C.

The three control signals A, B, C are provided by a control circuit 33, which receives a clock input $$\frac{CLK}{N}$$

and an input from the output 35 of the comparator 21 which output 35 supplies a control signal UP/DOWN.

On the digital side 19 of the circuit, the output 35 of the comparator 21 is supplied to an n-bit up-down counter 41, which provides a binary count on a number of parallel output lines 43 to a latch circuit 45. The number of parallel lines 43 may be, for example, eight in number. The latch 45 is enabled to latch the count of the counter 41 by a control signal LE supplied on a signal line 47 by control logic 49. This logic 49 receives input signals including the UP/DOWN control signal on line 35, a clock signal CLK, and a count signal. The functionality of the digital side circuitry 19 can, if desired, be embodied as part of a programmed digital processor 100, e.g., a microprocessor.

The clock signal CLK is a system clock signal, which may be generated in conventional fashion. The signal is divided by a divisor N at a divider block 51 to produce a signal denoted $$\frac{CLK}{N}.$$

Again, production of such a clock and divided clock signals may be accomplished by conventional techniques well-known in the art.

An illustrative example of operation of the circuit of FIG. 1 will now be provided, assuming that the dynamic range of $V_i(t)$ is zero to one volt, that the capacitor voltages $V_{C1}$ and $V_{C2}$ are initially zero, and that the counter 41 is an 8 bit counter (0 to 255). Assuming $V_i(t)$ rises to ½ volt and is sampled at that value by application of the control signal C, the voltage on the sampling capacitor $C_2$ will be higher than that on the first capacitor $C_1$, which will result in a "true" or "positive" output from the comparator 21. The production of a "true" output turns on switch B, causing the current from the current source 29 to linearly charge the first capacitor $C_1$. The "true" signal on the output 35 further causes the up/down counter 41 to begin counting up. When the voltage on the first capacitor $C_1$, reaches the value of the voltage on the second or sample capacitor $C_2$, the output 35 of the comparator 21 changes state causing the count of the UP/DOWN counter 41 to stop at a binary value representative of ½ volt, which is then captured by the latch 45. Thus, an eight bit count has been developed by a change of state on only one analog signal line 35.

Next, assume that at the next sample time, $V_i(t)$ drops by 5 millivolts. $V_{C1}$ is then smaller than $V_{C2}$, resulting in a false or negative signal on the output 35 of the comparator 21, which causes the UP/DOWN counter 41 to begin counting down and further causes supply of a control signal A to the switch 25, thereby beginning to linearly reduce the voltage on the first capacitor $C_1$. When this voltage again equals the voltage on the sampling capacitor $C_2$, the signal count on the comparator output 35 freezes the UP/DOWN counter 41, whose output is then latched by the latch 45.

With respect to clock frequencies, a 32 KHz clock is a frequency typical of those running on typical digital chips. For an eight bit UP/DOWN counter 42, the sample period is then 7.8 milliseconds. The control signal C thus has a frequency of 32.768 KHz/256=128 Hz.

Figure 2:
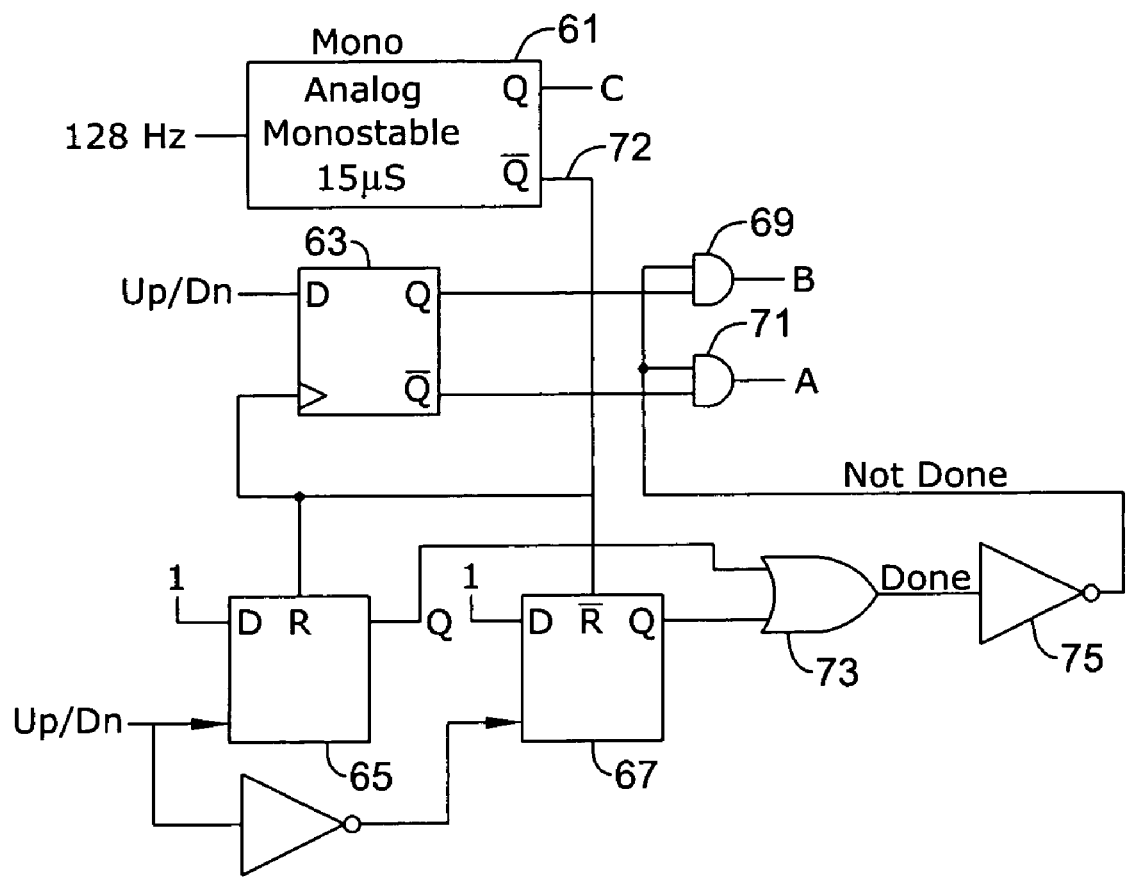
FIG. 2 is an electrical circuit diagram of illustrative logic for use in implementing the analog side control block 33 of FIG. 1.

FIG. 2 depicts illustrative control logic for implementing block 33 of FIG. 1 so as to generate the sample signal C and control the operation of the current sources 27, 29. This logic includes a monostable multivibrator 61, three flip-flops 63, 65, 67, two AND gates 69, 71, an OR gate 73, and an inverter 75.

Figure 4:
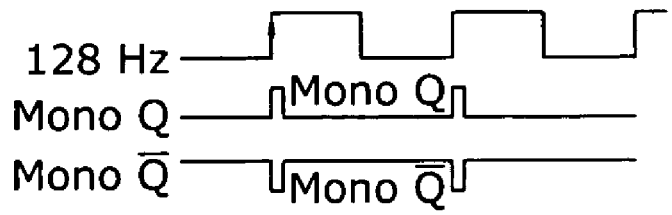
FIG. 4 is a waveform diagram useful in illustrating operation of the circuitry of FIG. 2.

A conversion begins on each rising edge of the 128 Hz sample clock shown in FIG. 4. The sample signal C is generated on this rising edge by the monostable 61. The $\overline{Q}$ output 72 of the monostable 61 goes low on this rising edge, resetting the flip-flops 65 and 67 such that their Q outputs are low and there is no "DONE" signal on the output of the OR gate 73. If the UP/DN signal from the comparator 21 changes state, the Q output of one of the flip-flops 65, 67 will go true, such that the "DONE" output of the OR gate 73 will go true also.

The UP/DN signal also is supplied to the flip-flop 63 whose Q and $\overline{Q}$ outputs form respective inputs to the two AND gates 69, 71. Each of these gates 69, 71 receives the output of the inverter 75 ("NOT DONE") as its second input. Thus, the output B of the AND gate 69 will be true if a comparison is underway and the comparator output 35 is positive, while the output A of the AND gate 71 will be true if a comparison is underway and the comparator output 35 is negative. As noted above, when the comparator 21 changes state, i.e., when the voltage on the capacitor $C_2$ equals the sample voltage, the DONE output goes true, thereby disabling the AND gates 69, 71 and, as the case may be, terminating charging or discharging of the capacitor $C_1$.

FIG. 4 is a waveform diagram useful in illustrating operation of the circuitry of FIG. 2. The waveform shows a 128 Hertz clock signal, with a monostable pulse Q from the monostable vibrator, which is high for a brief time period following the upward change of the clock signal. During this brief high time, the analog signal is sampled and, as explained above, the latches shown in FIG. 2 are reset.

Figure 3:
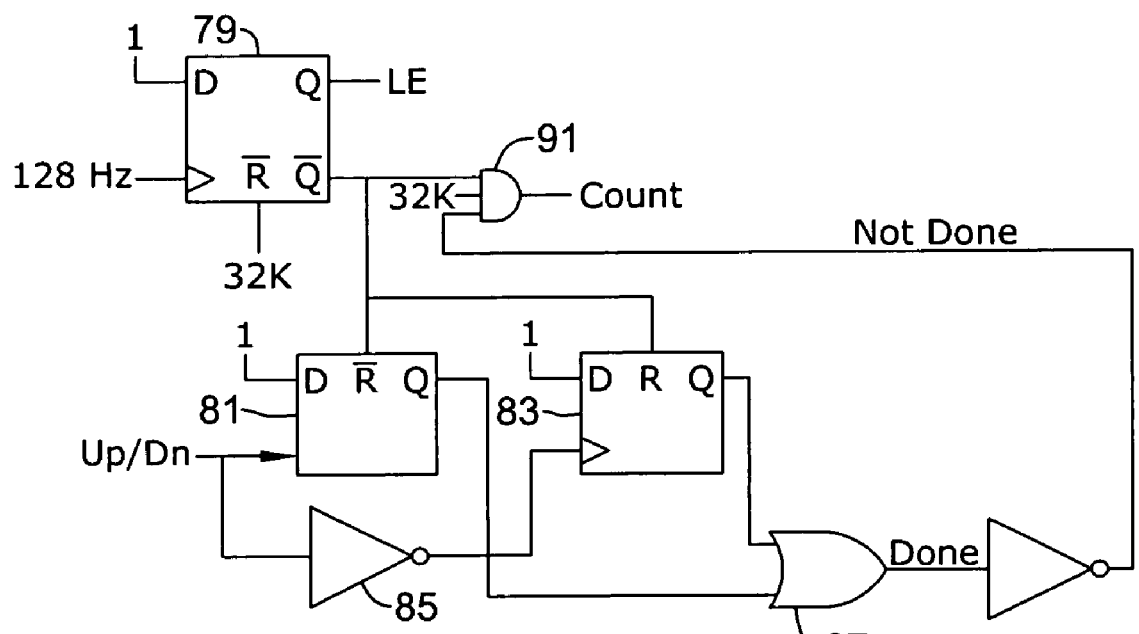
FIG. 3 is an electrical circuit diagram illustrative of logic for use in implementing the digital side control block 49 of FIG. 1.

FIG. 3 depicts illustrative control logic for implementing block 49 of FIG. 1 so as to generate the latch enable signal LE and control supply of the COUNT signal to the UP/DOWN counter 41. This logic includes three flip-flops 79, 81, 83, an inverter 85, an OR gate 87, an inverter 89, and an AND gate 91. The flip-flop 79 generates Q and $\overline{Q}$ each cycle of the 128 Hz clock. The flip-flop 79 thereby resets the active low reset flip-flops 81, 83 on the rising edge of the sample clock pulse, and generates the latch enable signal LE on the falling edge of the sample clock pulse.

The three input AND gate 91 controls the 32 KHz clock signal COUNT provided to the up-down counter 41. The three inputs to the AND gate 91 are the $\overline{Q}$ output of the flip-flop 79, the 32 KHz clock signal, and the "NOT DONE" output of the inverter 89.

In operation of the logic of FIG. 3, when no conversion is underway, the DONE signal is "true," which gates off the clock as a result of the "false" input provided by the inverter 89 to the AND gate 91. When a conversion begins, the UP/DN signal input to the flip-flop 81 causes the NOT DONE signal to go "true," thereby permitting the 32 KHz clock signal to pass through the AND gate 91, thereby causing the UP/DOWN counter 41 to begin counting. When the output 35 of the comparator 21 changes state, the input of the UP/DN signal to the flip-flop 81 causes the DONE signal to again go true, freezing the count of the counter 41 at a value representative of the value of the analog sample of $V_{i(t)}$ currently held by the sample capacitor $C_2$.

Figure 5:
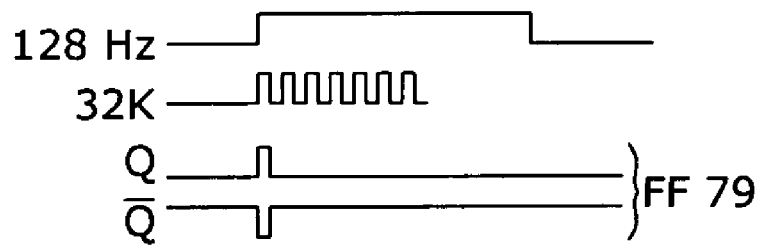
FIG. 5 is a waveform diagram useful in illustrating operation of the circuitry of FIG. 3.

FIG. 5 is a waveform diagram useful in illustrating operation of the circuitry of FIG. 3. The latch enable signal LE is shown, LE being the Q output of flip-flop 79. It can be seen that, since the flip-flop 79 (FIG. 3) goes high only when both the 128 Hertz signal and the 32 KHz signal rise, the latch 45 (FIG. 1) periodically reads the output of the counter 41 (FIG. 1).

Figure 6:
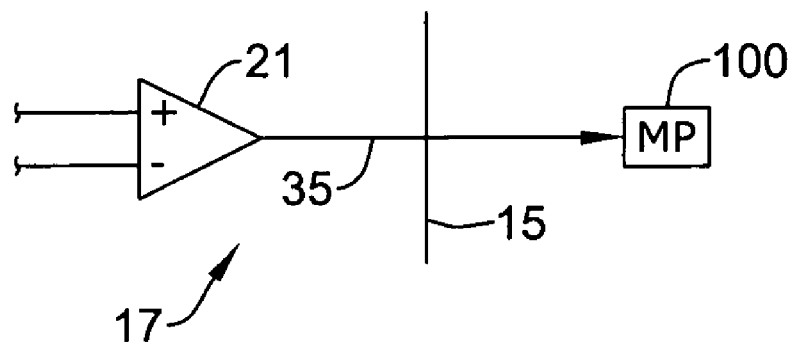
FIG. 6 is a schematic block diagram of an embodiment employing a programmed digital processor.

FIG. 6 is a schematic block diagram of an embodiment employing a programmed digital processor. Line 15 divides FIG. 6 into digital and analog sides. Referring back to FIG. 1, the microprocessor 100 (FIG. 6) is shown embodying the digital side 19 of the circuit in FIG. 1, receiving an output signal 35 from the up/down comparator 21 on the analog side 17.

While the present invention has been described above in terms of specific embodiments, it is to be understood that the invention is not limited to the disclosed embodiments. On the contrary, the following claims are intended to cover various modifications and equivalent methods and structures included within the spirit and scope of the invention.

What is claimed is:

1. A method of cardiac signal analysis comprising:
capturing an electrical signal between implanted electrodes;
receiving the electrical signal on a first chip carrying substantially all analog components of a subcutaneous implantable cardioverter defibrillator (SICD);
sampling the electrical signal to create a first sample and storing the first sample on the first chip;
generating an output from the first chip by comparing the first sample to a stored sample also stored on the first chip using a comparator located on the first chip;
receiving the output from the first chip on a second chip carrying substantially all digital components of the SICD;
generating a digital signal on the second chip indicative of the amplitude of the captured electrical signal; and
wherein the output from the first chip is the output from the comparator.

2. The method of claim 1, wherein:
the stored sample is stored using capacitor means for holding charge;
if a voltage on the capacitor means is different from the first sample, a first circuit changes the charge stored on the capacitor means until the voltage on the capacitor means is substantially the same as the first sample;
the output from the first chip indicates a duration of time that elapses while the first circuit changes the charge stored on the capacitor means; and
the first circuit comprises:
a charging sub-circuit for increasing the charge on the capacitor means;
a discharging sub-circuit for decreasing the charge on the capacitor means; and
switches controlling whether the charging sub-circuit and the discharging sub-circuit are coupled to the capacitor means.

3. The method of claim 1, wherein the second chip includes a counter having an up/down input, wherein the output from the first chip is coupled to the up/down input.

4. The method of claim 1, wherein the first chip comprises primarily analog circuitry and the second chip comprises primarily digital circuitry.

5. The method of claim 1, wherein a clock signal is generated and used on both the first chip and the second chip to coordinate operations of the first chip and the second chip.

6. An implantable medical device comprising at least first and second implantable electrodes and operational circuitry including a first chip carrying substantially all analog components of a subcutaneous implantable cardioverter defibrillator (SICD) and a second chip carrying substantially all digital components of the SICD, the operational circuitry configured to perform cardiac signal analysis comprising:
capturing an electrical signal between the implantable electrodes;
receiving the electrical signal on the first chip;
sampling the electrical signal to create a first sample and storing the first sample on the first chip;
generating an output from the first chip by comparing the first sample to a stored sample also stored on the first chip using a comparator located on the first chip;
receiving the output from the first chip on the second chip;
generating a digital signal on the second chip indicative of the amplitude of the captured electrical signal; and
wherein the operational circuitry is configured such that the output from the first chip is the output from the comparator.

7. The implantable medical device of claim 6, wherein the first chip comprises capacitor means for holding charge and a first circuit and the operational circuitry is configured such that:
the stored sample is stored using the capacitor means;
if a voltage on the capacitor means is different from the first sample, the first circuit changes the charge stored on the capacitor means until the voltage on the capacitor means is substantially the same as the first sample;
the output from the first chip indicates a duration of time that elapses while the equalizing circuit changes the charge stored on the capacitor means; and
the first circuit comprises:
a charging sub-circuit for increasing the charge on the capacitor means;
a discharging sub-circuit for decreasing the charge on the capacitor means; and
switches controlling whether the charging sub-circuit and the discharging sub-circuit are coupled to the capacitor means.

8. The implantable medical device of claim 6, wherein the second chip includes a counter having an up/down input, wherein the output from the first chip is coupled to the up/down input.

9. The implantable medical device of claim 6, wherein the first chip comprises primarily analog circuitry and the second chip comprises primarily digital circuitry.

10. The implantable medical device of claim 6, further comprising a clock, the clock generating a clock signal that is delivered to both the first chip and the second chip.

11. A method of cardiac signal analysis comprising:
capturing a cardiac signal from electrodes implanted in a patient;
sampling a first sample related to a magnitude of the captured signal;
generating an output having a duration and a sign, the duration indicative of a magnitude of difference between the first sample and a previous sample and the sign indicative of a direction of difference between the first sample and a previous sample;
receiving the output at a counter and generating a digital output indicative of the magnitude of the first sample;
wherein the output is generated from analog circuitry on a first chip carrying substantially all analog components of a subcutaneous implantable cardioverter defibrillator (SICD) and the counter is disposed on a second chip carrying substantially all digital components of the SICD, the method further comprising conveying the output from the first chip to the second chip;
the output generated from the analog circuitry on the first chip is the output from a comparator.

12. The method of claim 11, wherein the comparator having a first input and a second input, the first input receiving a signal related to the first sample magnitude and the second input receiving a signal generated as follows:
at a first time, the second input receives a signal related to the previous sample magnitude;

at a second time, the second input receives a signal approximating the first sample magnitude; and, during a time period between the first time and the second time:
if the previous sample magnitude is greater than the first sample magnitude, the second input receives a signal that decreases in magnitude; or
if the previous sample magnitude is less than the first sample magnitude, the second input receives a signal that increases in magnitude.

13. The method of claim 12, wherein:
the second input is coupled to capacitor means;
the capacitor means is selectively coupled via a first switch to a charging circuit and via a second switch to a discharging circuit; and
the output from the comparator is used to selectively close one of the first switch or the second switch during the time period between the first time and the second time.

* * * * *

UNITED STATES PATENT AND TRADEMARK OFFICE
CERTIFICATE OF CORRECTION

| | | |
|---|---|---|
| PATENT NO. | : 7,623,920 B2 | Page 1 of 1 |
| APPLICATION NO. | : 11/170839 | |
| DATED | : November 24, 2009 | |
| INVENTOR(S) | : Alan H. Ostroff | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 777 days.

Signed and Sealed this

Twelfth Day of October, 2010

David J. Kappos
*Director of the United States Patent and Trademark Office*